(12) United States Patent
Sakong et al.

(10) Patent No.: US 8,304,791 B2
(45) Date of Patent: Nov. 6, 2012

(54) NITRIDE-BASED SEMICONDUCTOR LIGHT EMITTING DEVICE AND METHODS OF MANUFACTURING THE SAME

(75) Inventors: Tan Sakong, Yongin-si (KR); Joong-kon Son, Yongin-si (KR); Ho-sun Paek, Yongin-si (KR); Sung-nam Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 784 days.

(21) Appl. No.: 11/812,435

(22) Filed: Jun. 19, 2007

(65) Prior Publication Data

US 2008/0012002 A1 Jan. 17, 2008

(30) Foreign Application Priority Data

Jul. 13, 2006 (KR) ........................ 10-2006-0065861

(51) Int. Cl.
*H01L 33/32* (2010.01)

(52) U.S. Cl. ................ 257/94; 257/96; 257/13; 257/22; 257/E21.326; 257/E21.097; 438/11; 438/12

(58) Field of Classification Search ................ 257/9–22, 257/94–103, 193, 200, 201, E23.326, E21.34, 257/E33.025, E21.398, E21.441, E21.449, 257/E21.451, E33.038, E33.03, E33.033, 257/E21.097, E21.098; 438/11, 12, 14, 22, 438/48, 189, 190, 200
See application file for complete search history.

(56) References Cited

U.S. PATENT DOCUMENTS

| | | | |
|---|---|---|---|
| 2003/0205713 A1* | 11/2003 | Sato | 257/85 |
| 2004/0256611 A1* | 12/2004 | Kim et al. | 257/13 |
| 2005/0082548 A1 | 4/2005 | Sakong et al. | |
| 2005/0156153 A1* | 7/2005 | Futagawa | 257/14 |
| 2005/0168564 A1* | 8/2005 | Kawaguchi et al. | 347/237 |
| 2005/0202614 A1* | 9/2005 | Spruytte et al. | 438/167 |
| 2005/0205881 A1* | 9/2005 | Yamazoe et al. | 257/85 |
| 2006/0192195 A1* | 8/2006 | Lee | 257/14 |
| 2008/0038858 A1* | 2/2008 | Emerson et al. | 438/47 |

FOREIGN PATENT DOCUMENTS

| | | |
|---|---|---|
| JP | 2005-064364 | 3/2005 |
| KR | 1020030002916 | 1/2003 |
| KR | 1020050037084 | 4/2005 |
| KR | 1020060020449 | 3/2006 |

* cited by examiner

*Primary Examiner* — Cuong Q Nguyen
*Assistant Examiner* — Yosef Gebreyesus
(74) *Attorney, Agent, or Firm* — Harness, Dickey & Pierce, P.L.C.

(57) ABSTRACT

A nitride-based semiconductor light emitting device having a structure capable of improving optical output performance, and methods of manufacturing the same are provided. The active layer may include a first barrier layer formed of $In_xGa_{(1-x)}N$ ($0.01 \leq x \leq 0.05$) on a n-type semiconductor layer, a first diffusion barrier layer formed of $In_yGa_{(1-y)}N$ ($0 \leq y < 0.01$) on the first barrier layer, and doped with an anti-defect agent including at least one of an N (nitrogen) element and a Si (silicon) element, a quantum well layer formed of $In_zGa_{(1-z)}N$ ($0.25 \leq z \leq 0.35$) on the first diffusion barrier layer, a second diffusion barrier layer formed of $In_yGa_{(1-y)}N$ ($0 \leq y < 0.01$) on the quantum well layer, and doped with an anti-defect agent including at least one of an N element and a Si element, and a second barrier layer formed of $In_xGa_{(1-x)}N$ ($0.01 \leq x \leq 0.05$) on the second diffusion barrier layer. The nitride-based semiconductor light emitting device may include an n-type semiconductor layer, the active layer, and a p-type semiconductor layer that are sequentially stacked on a substrate.

22 Claims, 8 Drawing Sheets

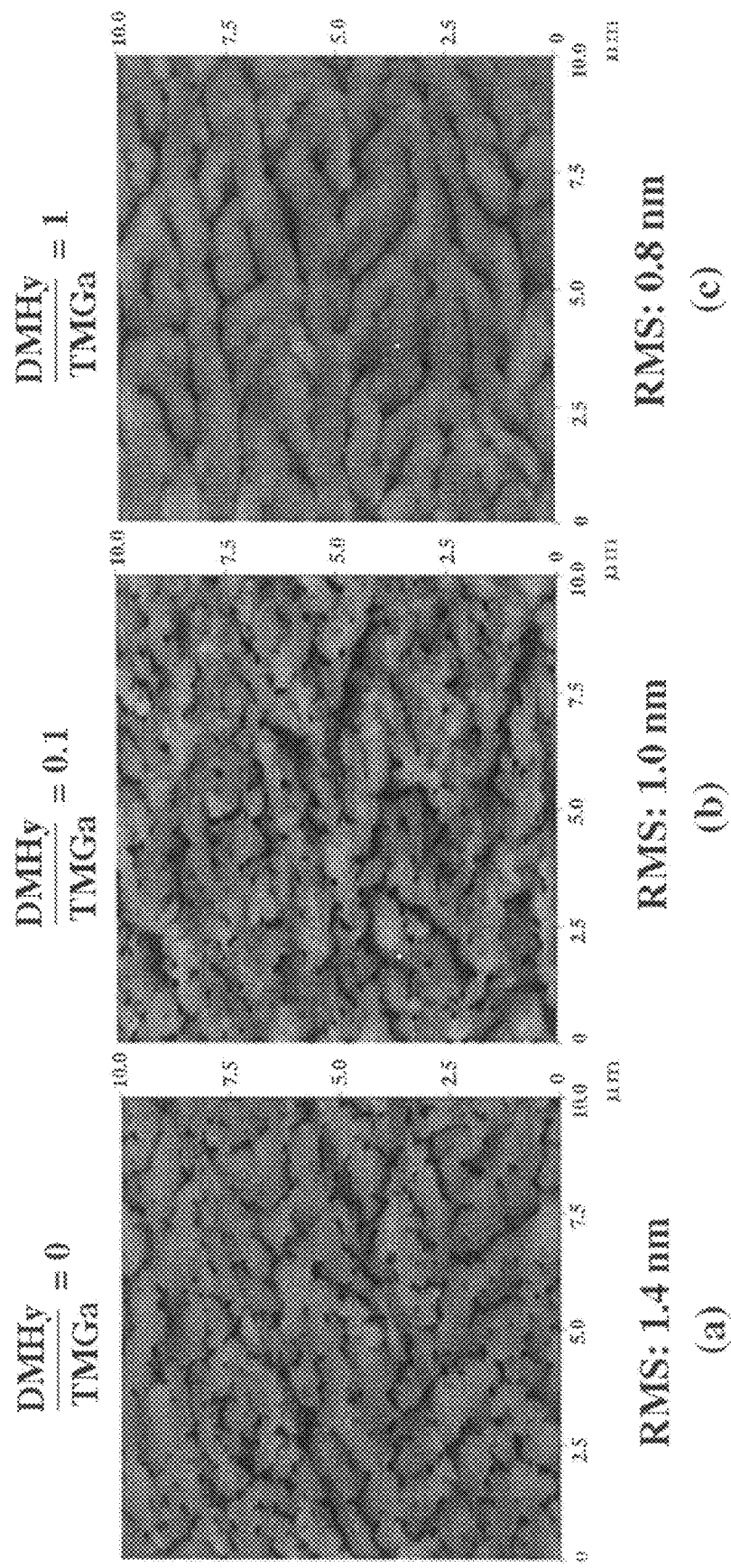

NITRIDE-BASED SEMICONDUCTOR LIGHT EMITTING DEVICE AND METHODS OF MANUFACTURING THE SAME

PRIORITY STATEMENT

This application claims priority under 35 U.S.C. §119 to Korean Patent Application No. 10-2006-0065861, filed on Jul. 13, 2006, in the Korean Intellectual Property Office (KIPO), the entire contents of which are incorporated herein by reference.

BACKGROUND

1. Field

Example embodiments relate to a semiconductor light emitting device and methods of manufacturing the same. Other example embodiments relate to an active layer, a nitride-based semiconductor light emitting device having an improved structure for optical output performance, and methods of manufacturing the same.

2. Description of the Related Art

A nitride-based semiconductor device has a relatively high melting point and relatively high heat resistance. Because the temperature dependency of the nitride-based semiconductor device is small, the nitride-based semiconductor device may be used for a light emitting device, e.g., a blue/green light emitting diode and a laser diode, and an electronic device, which is a high-speed switching and increased power device. A Group III-V nitride, e.g., gallium nitride (GaN) and/or indium gallium nitride (InGaN), may be a semiconductor material of the conventional nitride-based semiconductor device, and a light emitting device may be formed of the semiconductor material.

The semiconductor light emitting device may include an active layer that converts a current into light. The dominant material of the active layer of the nitride-based semiconductor light emitting device, which emits light having a blue wavelength or longer, may be InGaN. The band gap energy may be tuned by varying the amount of indium (In) in InGaN, thereby controlling the wavelength band of emitted light. The active layer may include a quantum well layer and a barrier layer formed as a pair to have a single quantum well structure and/or a multi-quantum well structure. The multi-quantum well structure may exhibit efficient light emission even at a relatively low current, and may have increased optical output as compared with the signal quantum well structure.

The InGaN-based active layer may have a stacked structure including the quantum well layer and the barrier layer that are stacked in the form of InGaN/GaN, InGaN/InGaN, InGaN/AlGaN and/or InGaN/InAlGaN. As the indium (In) ratio of the quantum well layer becomes higher, the bandgap may become smaller. Consequently, light having a relatively long wavelength band may be emitted. However, when the difference in the In ratio is larger between the quantum well layer and the barrier layer, the temperature instability and chemical instability may cause interdiffusion of the In elements between the quantum well layer and the barrier layer, thereby lowering the optical output of the active layer. Also, the diffusion of the elements may degrade the thin film properties of the active layer.

SUMMARY

Example embodiments provide a nitride-based semiconductor light emitting device having an improved structure for optical output performance, and methods of manufacturing the same.

According to example embodiments, a nitride-based semiconductor light emitting device may include an n-type semiconductor layer, an active layer and a p-type semiconductor layer sequentially stacked on a substrate, wherein said active layer may include a first barrier layer formed of $In_xGa_{(1-x)}N$ (about $0.01 \leq x \leq$ about $0.05$) on a n-type semiconductor layer, a first diffusion barrier layer formed of $In_yGa_{(1-y)}N$ (about $0 \leq y <$ about $0.01$) on the first barrier layer, and doped with an anti-defect agent including at least one of an N (nitrogen) element and a Si (silicon) element, a quantum well layer formed of $In_zGa_{(1-z)}N$ (about $0.25 \leq z \leq$ about $0.35$) on the first diffusion barrier layer, a second diffusion barrier layer formed of $In_yGa_{(1-y)}N$ (about $0 \leq y <$ about $0.01$) on the quantum well layer, and doped with an anti-defect agent including at least one of an N element and a Si element, and a second barrier layer formed of $In_xGa_{(1-x)}N$ (about $0.01 \leq x \leq$ about $0.05$) on the second diffusion barrier layer.

According to example embodiments, the method of forming a nitride-based semiconductor light emitting device comprising an n-type semiconductor layer, an active layer, and a p-type semiconductor layer sequentially stacked on a substrate, the method comprising forming the active layer may include forming a first barrier layer of $In_xGa_{(1-x)}N$ (about $0.01 \leq x \leq$ about $0.05$) on a n-type semiconductor layer, forming a first diffusion barrier layer of $In_yGa_{(1-y)}N$ (about $0 \leq y <$ about $0.01$) on the first barrier layer, and doped with an anti-defect agent including at least one of an N (nitrogen) element and a Si (silicon) element, forming a quantum well layer of $In_zGa_{(1-z)}N$ (about $0.25 \leq z \leq$ about $0.35$) on the first diffusion barrier layer, forming a second diffusion barrier layer of $In_yGa_{(1-y)}N$ (about $0 \leq y <$ about $0.01$) on the quantum well layer, and doped with an anti-defect agent including at least one of an N element and a Si element, and forming a second barrier layer of $In_xGa_{(1-x)}N$ (about $0.01 \leq x \leq$ about $0.05$) on the second diffusion barrier layer.

According to example embodiments, a method of manufacturing a nitride-based semiconductor light emitting device may include forming the n-type semiconductor layer on a substrate, forming the active layer according to example embodiments on the n-type semiconductor layer, and forming the p-type semiconductor layer on the active layer.

According to example embodiments, the active layer of the nitride-based semiconductor light emitting device may include the diffusion barrier layer between the quantum well layer and the adjacent barrier layer to prevent or reduce diffusion of an indium element, so that the optical output and light emission characteristics of the active layer may be improved.

BRIEF DESCRIPTION OF THE DRAWINGS

Example embodiments will be more clearly understood from the following detailed description taken in conjunction with the accompanying drawings. FIGS. 1-4 represent non-limiting, example embodiments as described herein.

FIG. 1 is a schematic cross-sectional view of a nitride-based semiconductor light emitting device according to example embodiments;

FIG. 2 is a graph showing the photoluminescence (PL) characteristics of a nitride-based semiconductor light emitting device according to example embodiments;

FIG. 4(a)-4(c) shows atomic force microscopy (AFM) images of improvement of surface roughness of a GaN diffusion barrier layer according to an increase in the flow of dimethyl hydrazine (DMHy).

Figure 1:
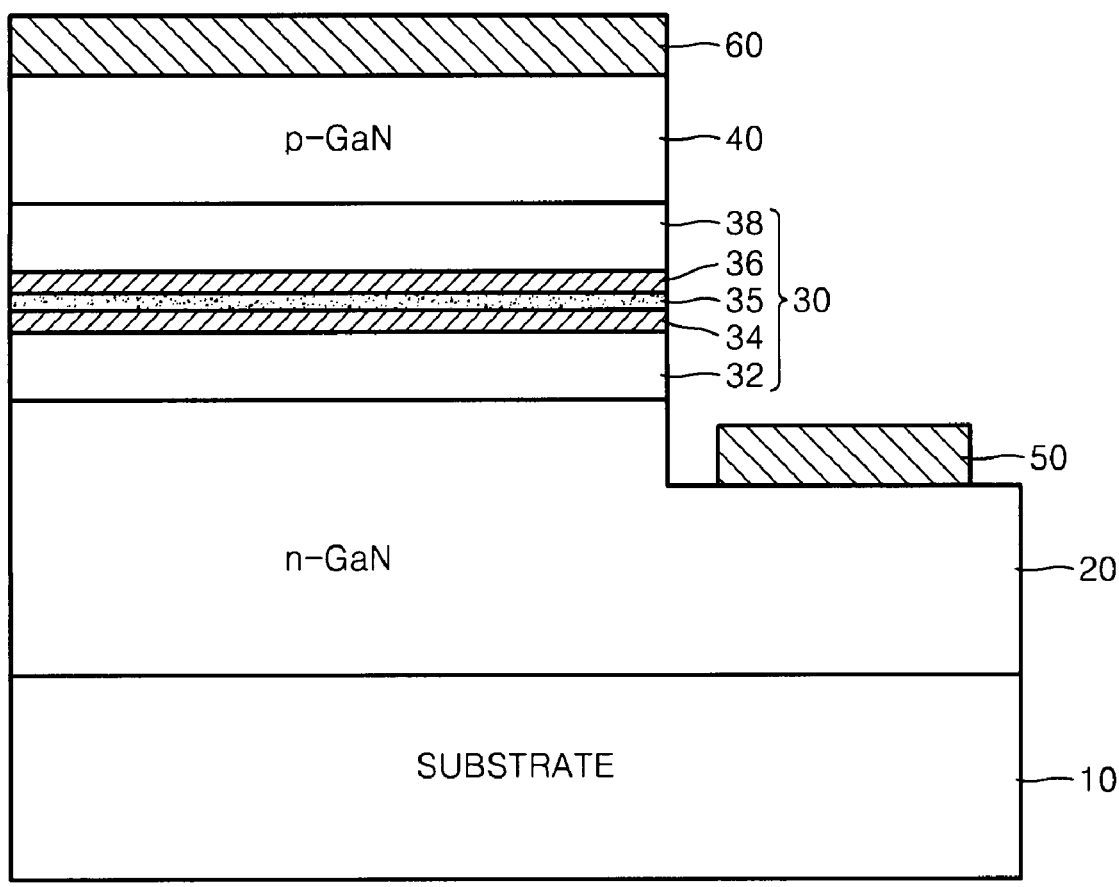

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. In the drawings, the thicknesses of layers and regions are exaggerated for clarity. Like numbers refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a nitride-based semiconductor light emitting device according to example embodiments. Referring to FIG. 1, the nitride-based semiconductor light emitting device may include a substrate 10, an n-type semiconductor layer 20, an active layer 30, and a p-type semiconductor layer 40. The n-type semiconductor layer 20, the active layer 30, and the p-type semiconductor layer 40 may be sequentially stacked on the substrate 10. The active layer 30 may include a first barrier layer 32, a first diffusion barrier layer 34, a quantum well layer 35, a second diffusion barrier layer 36, and a second barrier layer 38 that are sequentially stacked on the n-type semiconductor layer 20. An n-electrode (n-type electrode) 50 and a p-electrode (p-type electrode) 60 may be formed on an etched surface of the n-type semiconductor layer 20 and on the p-type semiconductor layer 50, respectively.

In the nitride-based semiconductor light emitting device of FIG. 1, when a predetermined or given voltage is applied between the n-electrode 50 and the p-electrode 60, electrons and holes may flow into the quantum well layer 35 within the active layer 30 from the n-type semiconductor layer 20 and the p-type semiconductor layer 40, respectively. Light may be emitted from the quantum well layer 35 by recombination of the electrons and the holes within the quantum well layer 35.

To obtain light having a green wavelength band, the composition ratio of indium in the quantum well layer 35 may range from about 25% to about 35%. The composition ratio of indium (In) in each of the first and second barrier layers 32 and 38 may be within a range of about 1% to about 5%, according to the composition ratio of indium (In) in the quantum well layer 35. For example, the quantum well layer 35 may be formed of $In_zGa_{(1-z)}N$ (about $0.25 \leq z \leq$ about 0.35), and each of the first and second barrier layers 32 and 38 may be formed of $In_xGa_{(1-x)}N$ (about $0.01 \leq x \leq$ about 0.05), so that extraction of light having a green wavelength band may be expected. The quantum well layer 35 may have a thickness of about 0.5 nm to about 20 nm. Each of the first and second barrier layers 32 and 38 may have a thickness of about 10 nm to about 30 nm. The thicknesses of the quantum well layer 35 and the first and second barrier layers 32 and 38 may not limit the scope of example embodiments.

When the quantum well layer 35 of InGaN and the first and second barrier layer 32 and 38 of GaN are stacked, a quantum well structure that may effectively confine carriers that flowed into the quantum well layer 35 may be provided because GaN has a relatively large energy band gap as compared to InGaN. However, the difference in the indium composition ratio between the quantum well layer 35 and the first and second barrier layers 32 and 38 may cause interdiffusion of indium (In) elements therebetween. The interdiffusion may become more active when the temperature increases with the optical output. Consequently, the interfacial properties/thin film properties of the quantum well layer 35 may be lowered, and the optical output may also be lowered. For example, the problem may become worse as the difference in the indium ratio between the quantum well layer 35 and the first and second barrier layers 32 and 38 becomes bigger.

To address this problem, the active layer 30, according to example embodiments, may further include the first and second diffusion barrier layers 34 and 36, which prevent or reduce the interdiffusion of the In elements between the quantum well layer 35 and the first and second barrier layers 32 and 38. The first and second diffusion barrier layers 34 and 36 may also serve to improve the optical output and light emitting characteristics of the active layer. Each of the first and second diffusion barrier layers 34 and 36 may be formed of $In_yGa_{(1-y)}N$ (about $0 \leq y <$ about 0.01) doped with an anti-defect agent including at least one of nitrogen (N) and silicon (Si) elements.

A GaN layer may be formed by reacting trimethyl gallium (TMGa) with ammonia ($NH_3$) through a metalorganic chemical vapor deposition (MOCVD) process. Although an increased growth temperature of about 1000° C. or higher is needed to form the high-quality GaN thin film, the layer growth may be made at a relatively low temperature ranging from about 600° C. to about 900° C. to prevent or reduce thermal damage from occurring at another material layer or a substrate constituting the light emitting device. However, when the GaN layer is formed at a temperature of about 700° C., the decomposition ratio of ammonia ($NH_3$) may be decreased to about 10% or lower, and thus the shortage of nitrogen may be caused, making it impossible to form the high-quality GaN layer. For this reason, defects, e.g., pits, may occur in the GaN layer, which make the surface of the GaN layer relatively rough, and thus, the layer quality of the quantum well layer or the second barrier layer formed on such a GaN diffusion barrier layer may be lessened. Consequently, the light emission efficiency of the active layer may be lessened. Therefore, in example embodiments, the GaN diffusion barrier layer may be doped with the anti-defect agent in order to prevent or reduce defects from occurring therein.

The anti-defect agent may serve not only to improve the surface roughness of the growing $In_yGa_{(1-y)}N$ layer (about $0 \leq y <$ about 0.01) by preventing or reducing defects, e.g., pits, but also to minimize or decrease point defects, e.g., vacancies in the $In_yGa_{(1-y)}N$ layer. The defects, e.g., pits or vacancies, occurring in the $In_yGa_{(1-y)}N$ layer, may be filled with a nitrogen (N) element and a silicon (Si) element, and thus may be removed. The doping concentration of the N and Si elements used as the anti-defect agent may be limited to a range of 1 E3 atoms/cm³ to 1 E20 atoms/cm³. If the doping concentration of the N element and the Si element becomes higher than 1 E20 atoms/cm³, a by-product reaction of an N source material including the N element, and the Si element may lessen the layer properties of the $In_yGa_{(1-y)}N$ layer. Each of the first and second diffusion barrier layers 34 and 36 may have a thickness of about 0.2 nm to about 6 nm. If the thicknesses of the first and second diffusion barrier layers 34 and 36 are thinner than about 0.2 nm, the layers 34 and 36 may become insufficient to prevent or reduce the diffusion of the In element. If the thicknesses of the first and second diffusion barrier layers 34 and 36 are thicker than about 6 nm, the layers 34 and 36 may hinder flow of carriers introduced to the quantum well layer 35.

The N element for the anti-defect agent doping may be obtained from at least one N source material selected from the group consisting of monomethyl hydrazine (MMHy) and dimethyl hydrazine (DMHy). The N source material may be more easily decomposed at a temperature lower than about 500° C. Therefore, the deficiency of the N element caused by the relatively low growth temperature may be supplemented at the time of forming the GaN layer, thereby lowering the N vacancy concentration in the GaN layer. Also, because the two-dimensional growth of the GaN layer is facilitated, the surface roughness may be improved, and thus the quality of the GaN diffusion barrier layer may be improved.

The Si element may be obtained from at least one Si source material selected from the group consisting of silane ($SiH_4$), disilane ($Si_2H_6$), methyl silane ($CH_3SiH_3$), dimethyl silane (($CH_3)_2SiH_2$), diethyl silane (($C_2H_5)_2SiH_2$), trimethyl silane (($CH_3)_3SiH$), triethyl silane (($C_2H_5)_3SiH$), tetramethyl silane (TMSi) and tetraethyl silane (TESi). The Si source material may also be more easily decomposed at a temperature lower than about 500° C. Therefore, the Si element may serve not only to lower the Ga vacancy concentration in the GaN layer but also to facilitate the two-dimensional growth of the GaN layer, thereby improving the surface roughness and increasing the quality of the GaN diffusion barrier layer.

Although the active layer 30 has a single quantum well structure in the drawing, the scope of example embodiments may not be limited to this structure. The active layer 30 may further include another first diffusion barrier layer 34, another quantum well layer 35, another second diffusion barrier layer 36 and another second barrier layer 38 that are sequentially stacked between the second barrier layer 38 and the p-type semiconductor layer 40, so that the active layer may have a multi-quantum well structure.

The substrate 10 may be any one of Si, GaAs, SiC, GaN and sapphire substrates. The n-type semiconductor layer 20 may be formed of a Group III-V nitride-based semiconductor material, e.g., AlInGaN or n-GaN. The p-type semiconductor layer 40 may be formed of a Group III-V nitride-based semiconductor material, for example, p-GaN or p-GaN/AlGaN.

The n-electrode 50 and the p-electrode 60 may be formed of a conductive material, for example, a metal material, e.g., Au, Al and Ag and/or a transparent conductive oxide. The transparent conductive oxide may be any one selected from the group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{(1-x)}Mg_xO$ (about $0 \leq x \leq$ about 1)). For example, the transparent conductive oxide may be $Zn_2In_2O_5$, $GaInO_3$, $ZnSnO_3$, F-doped $SnO_2$, Al-doped ZnO, Ga-doped ZnO, MgO and ZnO.

Figure 2:
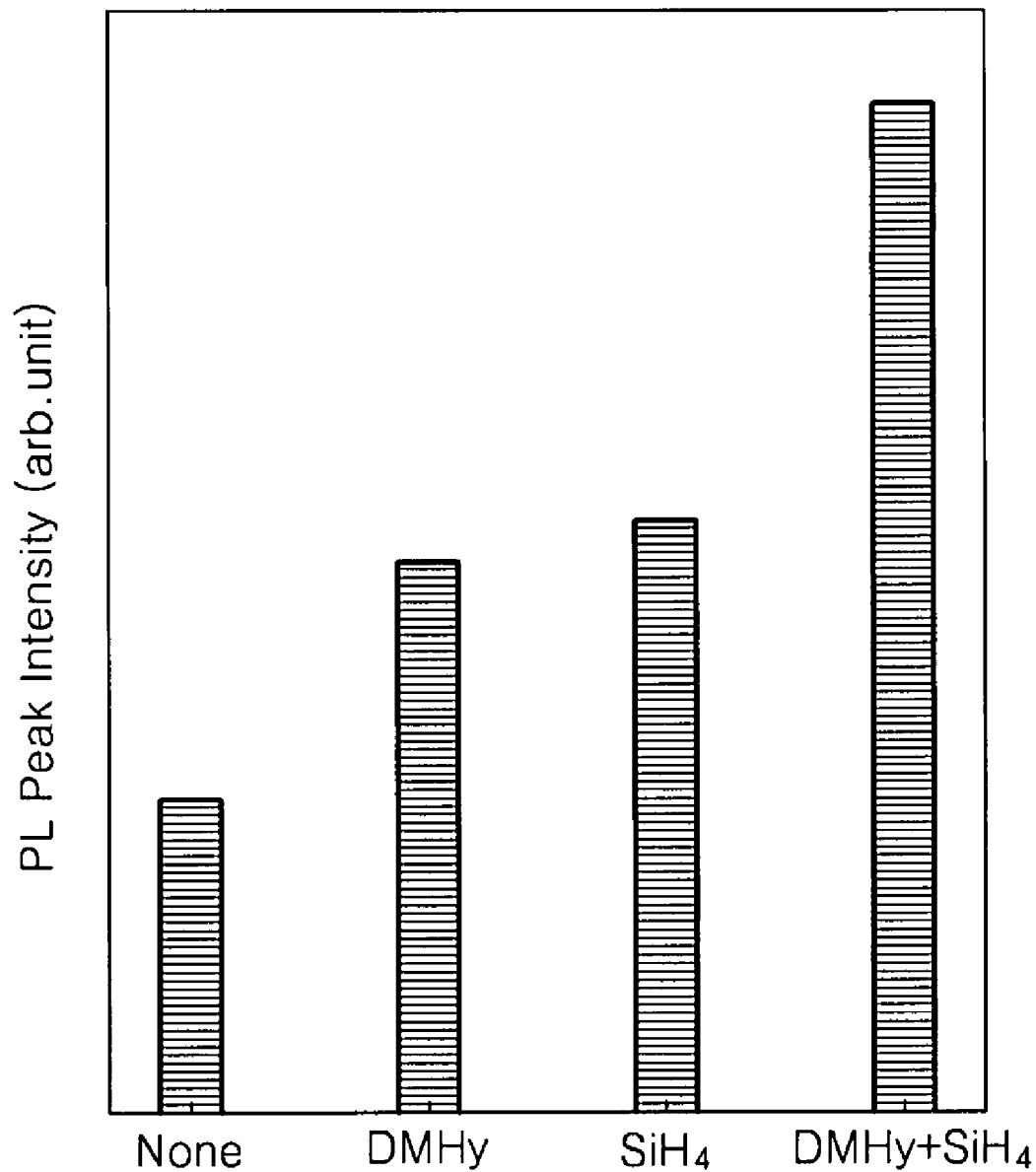

FIG. 2 is a graph illustrating the photoluminescence (PL) characteristics of a nitride-based semiconductor light emitting device according to example embodiments. Referring to FIG. 2, four bars are shown in the graph. The first bar illustrates the PL peak intensity of the light emitting device having a diffusion barrier layer doped with no anti-defect agent. The second bar illustrates the PL peak intensity of the light emitting device having a diffusion barrier layer doped with only the N element by supplying DMHy at the time of forming the diffusion barrier layer. The third bar illustrates the PL peak intensity of the light emitting device having a diffusion barrier layer doped with only the Si element by supplying $SiH_4$ at the time of forming the diffusion barrier layer. The fourth bar illustrates the PL peak intensity of the light emitting device having a diffusion barrier layer doped with both the N and Si elements by supplying both DMHy and $SiH_4$ at the time of forming the diffusion barrier layer. When one of the N and Si elements is added, the PL peak intensity is twice higher than when none of the N and Si elements are added. When both of the N and Si elements are added, the PL peak intensity may be four times higher than when neither are added.

FIGS. 3A-3F are views showing processes of a method of manufacturing a nitride-based semiconductor light emitting device according to example embodiments. Each of material layers may be formed by various vacuum deposition methods, e.g., a metalorganic chemical vapor deposition (MOCVD) method, a molecular beam epitaxy (MBE) method, a halide vapor phase epitaxy (HVPE) method, a liquid phase epitaxy (LPE) method, a chemical vapor deposition (CVD) method and/or a sputtering method.

Figure 3A:
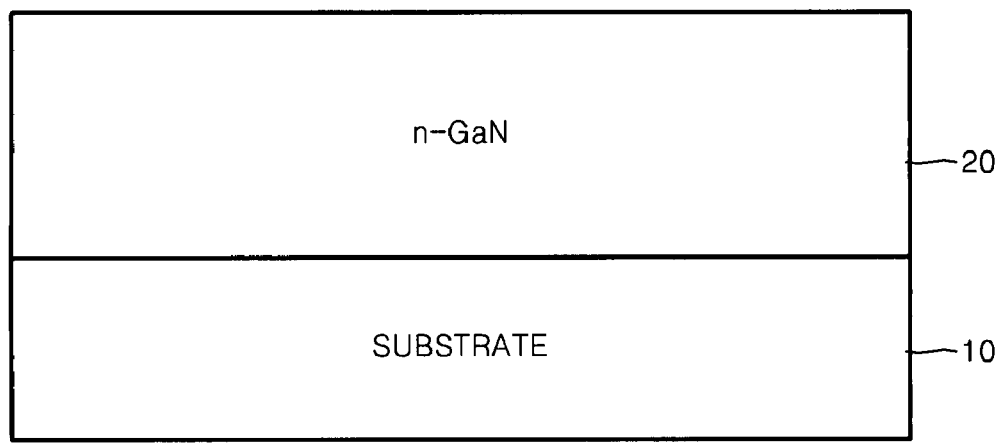
FIGS. 3A-3F are views showing processes of a method of manufacturing a nitride-based semiconductor light emitting device according to example embodiments.

Referring to FIG. 3A, an n-type semiconductor layer 20 may be formed on a prepared substrate 10, e.g., a Si, GaAs, SiC, GaN and/or sapphire substrate, by a stacking method using the same type of materials (e.g., by growing a GaN-based crystalline layer on a GaN substrate) or using different types of materials (e.g., by growing a GaN-based crystalline layer on a sapphire layer). The n-type semiconductor layer 20 may be formed of a Group III-V nitride-based semiconductor material, for example, AlInGaN or n-GaN.

Figure 3B:
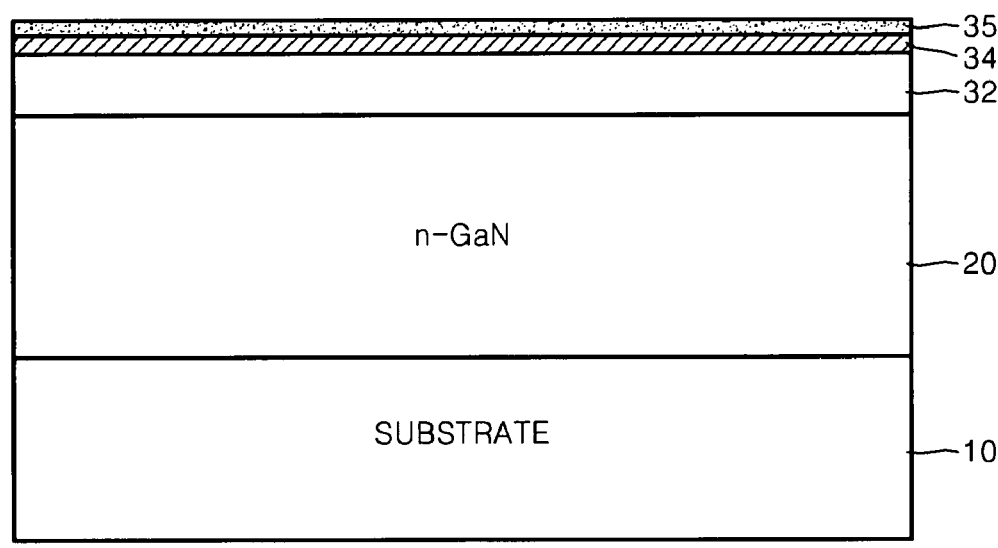

Referring to FIG. 3B, a first barrier layer 32, a first diffusion barrier layer 34 and a quantum well layer 35 may be sequentially formed on the n-type semiconductor layer 20. The first diffusion barrier layer 34 may act as a barrier to prevent or reduce interdiffusion of indium (In) elements between the quantum well layer 35 and the first barrier layer 32, which is a characteristic feature of example embodiments. The first barrier layer 32 may be formed of $In_xGa_{(1-x)}N$ (about $0.01 \leq x \leq$ about 0.05). For example, the first barrier layer 32 may be formed by reacting trimethyl gallium (TMGa), trimethyl indium (TMI) and ammonia ($NH_3$) at the temperature of about 600° C. to about 900° C. by the MOCVD process. The thickness of the first barrier layer 32 may have a thickness of about 10 nm to about 30 nm.

The first diffusion barrier layer 34 may be formed on the first barrier layer 32. The first diffusion barrier layer 34 may be formed of $In_yGa_{(1-y)}N$ (about $0 \leq y <$ about 0.01) doped with an anti-defect agent including at least one of an N element or a Si element. For example, the first diffusion barrier layer 34 may be obtained by reacting a doping gas including at least one of an N source material and a Si source material with a reaction gas including TMGa and $NH_3$ at the temperature of about 600° C. to about 900° C. by the MOCVD process. The first diffusion barrier layer 34 may be formed of GaN. The reaction gas may further include TMI to form the first diffusion barrier layer 34, and the first diffusion barrier layer 34 may be formed of InGaN.

The GaN layer may be formed by reacting TMGa and $NH_3$ through the MOCVD process. To increase the quality of the GaN layer, an increased growth temperature of about 1000° C. or higher may be required. However, the layer growth may be made at the relatively low temperature of about 600° C. to about 900° C. in order to prevent or reduce thermal damage to another material layer or the substrate constituting the light emitting diode. However, if the GaN layer is formed at about 700° C., the decomposition ratio of $NH_3$ may be lowered to about 10% or less, and thus the shortage of the N element may occur, making it difficult or impossible to form the GaN layer of increased quality. For this reason, defects, e.g., pits, may occur in the GaN layer, which make the surface of the GaN layer rough, and thus the layer quality of the quantum well layer 35 and a second barrier layer formed on the GaN diffusion barrier layer may be degraded, thereby lowering the light emission efficiency of the active layer. Therefore, in example embodiments, the GaN diffusion barrier layer may be doped with an anti-defect agent to prevent or reduce the defects from occurring.

The anti-defect agent may serve not only to improve the surface roughness of the $In_yGa_{(1-y)}N$ layer by preventing or reducing defects, e.g., pits, from occurring at the growing $In_yGa_{(1-y)}N$ layer (about $0 \leq y <$ about 0.01) but also to minimize or decrease point defects, e.g., vacancies, within the $In_yGa_{(1-y)}N$ layer. The defects, e.g., the pits or vacancies, generated in the $In_yGa_{(1-y)}N$ layer, may be filled with the added N element or the SI element, and thus, may be removed.

An N source material for the anti-defect agent doping may include at least one selected from the group consisting of monomethyl hydrazine (MMHy) and dimethyl hydrazine (DMHy). The flow of DMHy may be controlled to meet the condition of about $0 <$ (DMHy/TMGa) $<$ about 20. If the ratio of DMHy/TMGa is higher than about 20, an unexpected by-product reaction may occur from the supplied DMHy, and the by-product reaction may cause the layer properties of the $In_yGa_{(1-y)}N$ layer to be degraded.

The N source material may be more easily decomposed at a temperature lower than about 500° C. Accordingly, the deficiency of the N element caused by the decreased growth temperature may be supplemented at the time of forming the GaN layer, and thus the N vacancy concentration within the GaN layer may be lowered. Also, the two-dimensional growth of the GaN layer may be facilitated, thereby improving the surface roughness and increasing the quality of the GaN diffusion barrier layer.

Also, a Si source material for the anti-defect agent doping may include at least one selected from the group consisting of silane ($SiH_4$), disilane ($Si_2H_6$), methyl silane ($CH_3SiH_3$), dimethyl silane (($CH_3)_2SiH_2$), diethyl silane (($C_2H_5)_2SiH_2$), trimethyl silane (($CH_3)_3SiH$), triethyl silane (($C_2H_5)_3SiH$), tetramethyl silane (TMSi), and tetraethyl silane (TESi). The doping concentration of the Si element may be limited to a range of about 1 E3 atoms/$cm^3$ to about 1 E20 atoms/$cm^3$. If the doping concentration of the Si element becomes higher than about 1 E20 atoms/cm$^3$, an extra Si element may cause the layer property of the In$_y$Ga$_{(1-y)}$N layer to be lowered.

The Si source material may also be more easily decomposed at a temperature lower than about 500° C. Because the Si element serves not only to lower the Ga vacancy concentration within the GaN layer but also to facilitate the two-dimensional growth of the GaN layer, the surface roughness may be improved, and thus the quality of the GaN diffusion barrier layer may be increased.

The first diffusion barrier layer 34 may have a thickness of about 0.2 nm to about 6 nm. If the thickness of the first diffusion barrier layer 34 is thinner than about 0.2 nm, the first diffusion barrier layer 34 may be insufficient to prevent or reduce the diffusion of the In element. If the thickness of the first diffusion barrier layer 34 is thicker than about 6 nm, the first diffusion barrier layer 34 may hinder flow of carriers introduced to the quantum well layer 35.

Then, the quantum well layer 35 may be formed of In$_z$Ga$_{(1-z)}$N (about 0.25≦z≦about 0.35) on the first diffusion barrier layer 34. For example, the quantum well layer 35 may be formed by reacting TMGa, TMI and NH$_3$ at the temperature of about 600° C. to about 900° C. by the MOCVD process, and may have a thickness of about 0.5 nm to about 20 nm.

Figure 3C:
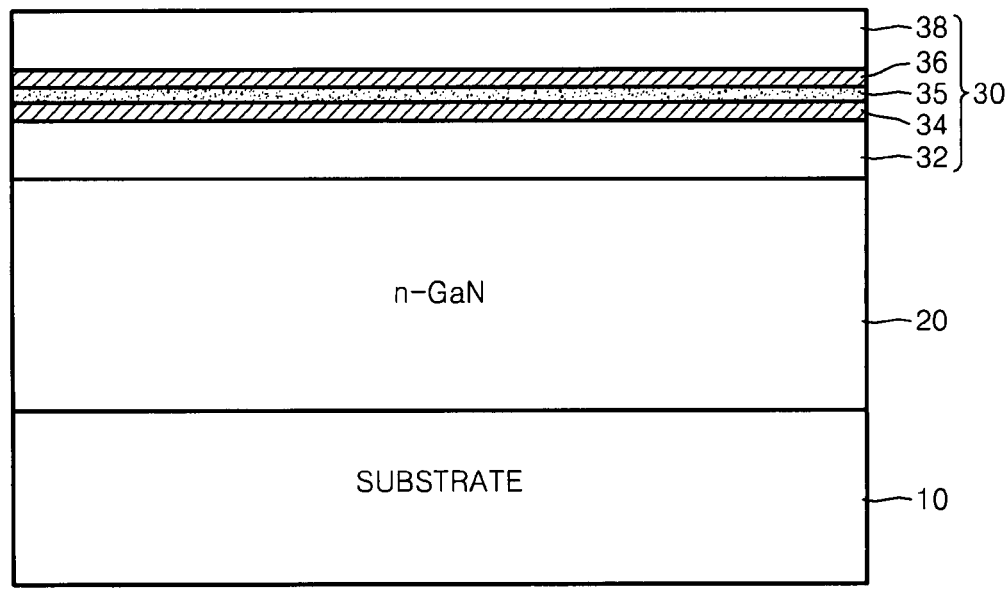

Referring to FIG. 3C, a second diffusion barrier layer 36 and a second barrier layer 38 may be sequentially formed on the quantum well layer 35 by the MOCVD process. Because the forming material and method of the second diffusion barrier layer 36 and the second barrier layer 38 are the same as those of the aforementioned first diffusion barrier layer 34 and the first barrier layer 32, the descriptions thereof will be omitted.

Figure 3D:
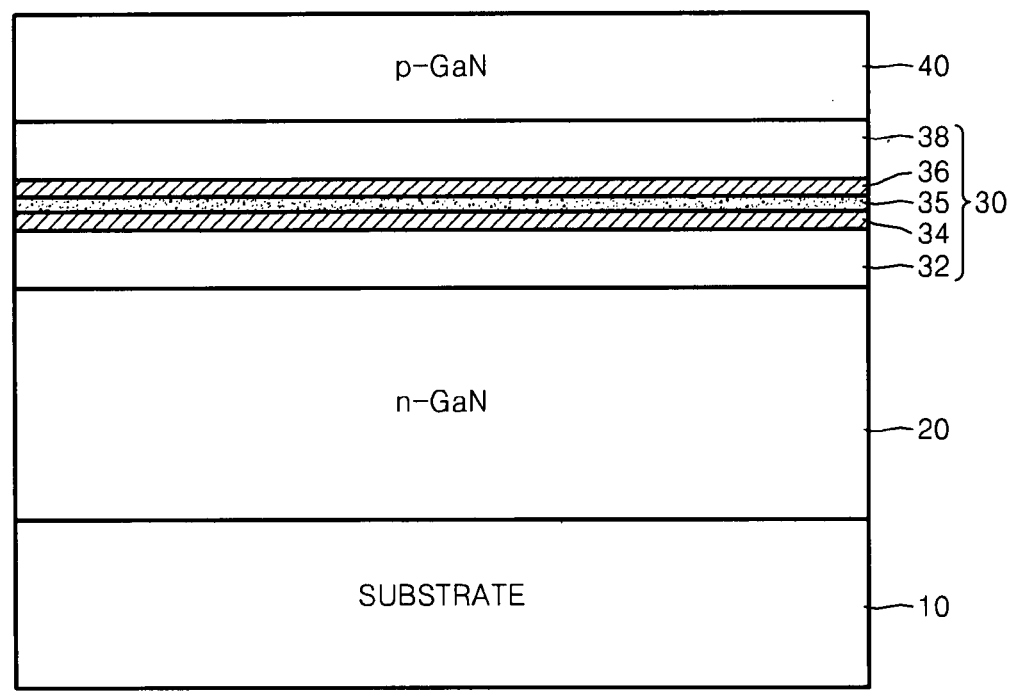

Referring to FIG. 3D, a p-type semiconductor layer 40 may be formed on the active layer 30 including the first barrier layer 32, the first diffusion barrier layer 34, the quantum well layer 35, the second diffusion barrier layer 36 and the second barrier layer 38. The p-type semiconductor layer 40 may be formed of a Group III-V nitride-based semiconductor material, e.g., p-GaN or p-GaN/AlGaN.

Figure 3E:
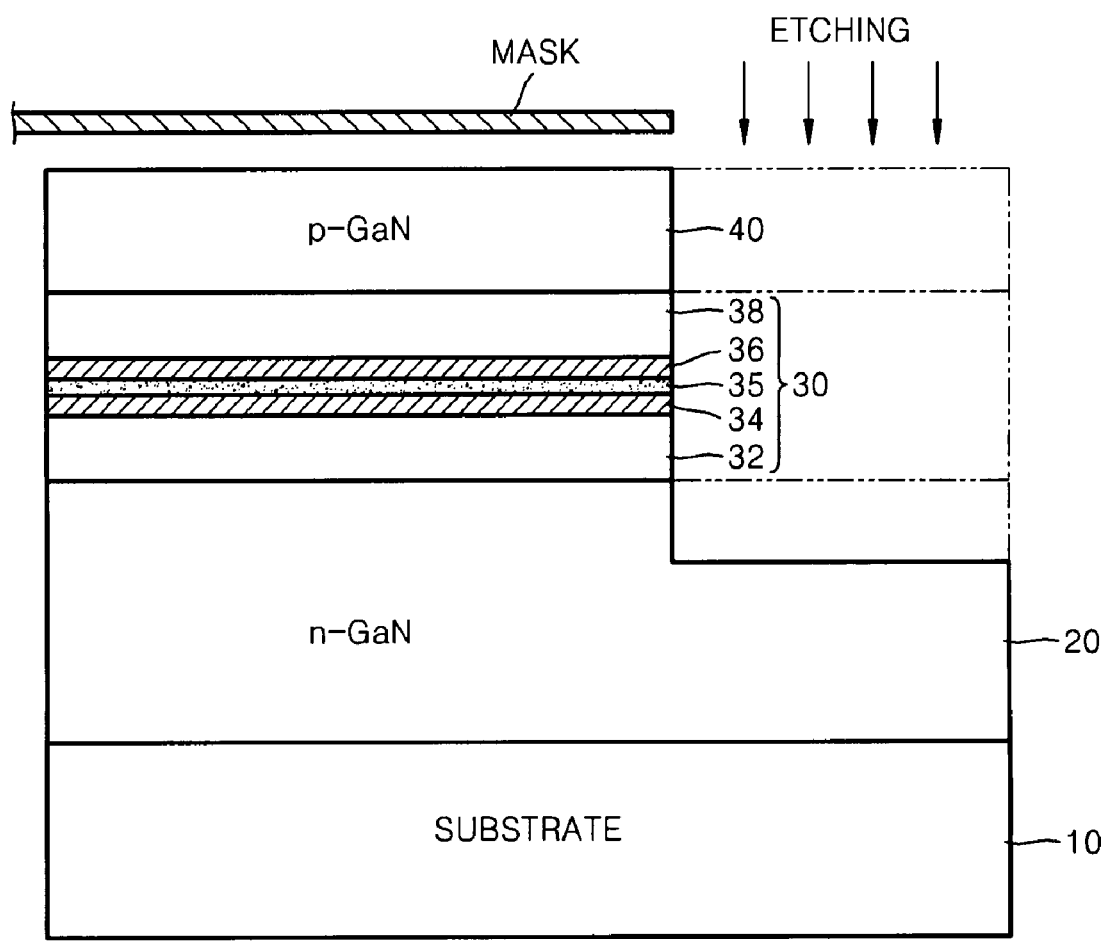
Figure 3F:
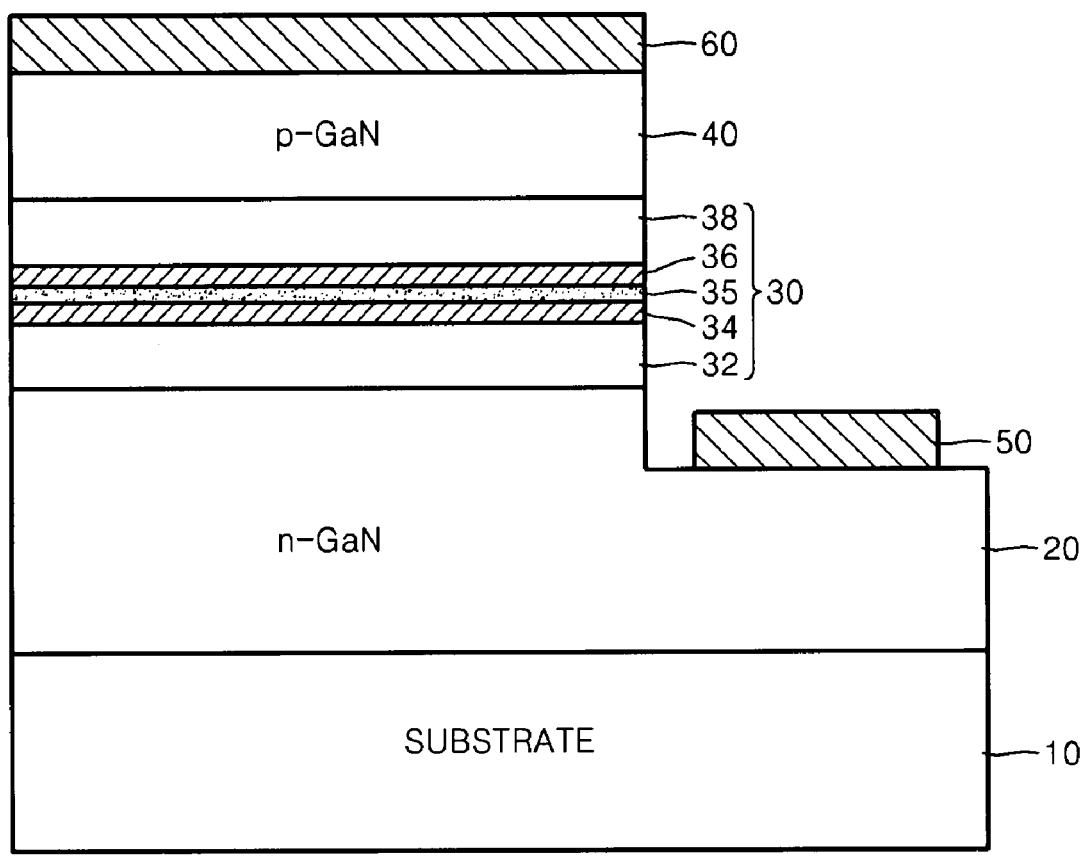

Referring to FIGS. 3E and 3F, etching may be performed from a predetermined or given region of a top surface of the p-type semiconductor layer 40 to a predetermined or given depth of the n-type semiconductor layer 20, thereby forming an etched surface on the n-type semiconductor layer 20. Thereafter, the n-electrode 50 and the p-element 60 may be formed of a conductive material, for example, a metal material, e.g., Au, Al and Ag or a transparent conductive oxide, on the etched surface of the n-type semiconductor layer 20 and the p-type semiconductor layer 40, respectively. The transparent conductive oxide may be any one selected from the group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), In$_4$Sn$_3$O$_{12}$ and zinc magnesium oxide (Zn$_{(1-x)}$Mg$_x$O (0≦x≦1)). For example, the transparent conductive oxide may be Zn$_2$In$_2$O$_5$, GaInO$_3$, ZnSnO$_3$, F-doped SnO$_2$, Al-doped ZnO, Ga-doped ZnO, MgO and ZnO.

The nitride-based semiconductor light emitting device according to example embodiments may be manufactured through the aforementioned processes. In example embodiments, the first barrier layer 32, the first diffusion barrier layer 34, the quantum well layer 35, the second diffusion barrier layer 36, and the second barrier layer 38 may be sequentially stacked by the in-situ process. When these layers are formed through the in-situ process in an MOCVD device, the process may be more simplified, and the increased quality layers may be obtained.

Although the active layer 30 has a single quantum well structure in the drawings, example embodiments may not be limited to this structure. For example, another first diffusion barrier layer 34, another quantum well layer 35, another second diffusion barrier layer 36, and another barrier layer 38 may be sequentially further stacked between the second barrier layer 38 and the p-type semiconductor layer 40, so that the active layer 30 may have a multi-quantum well structure.

Figure 5:
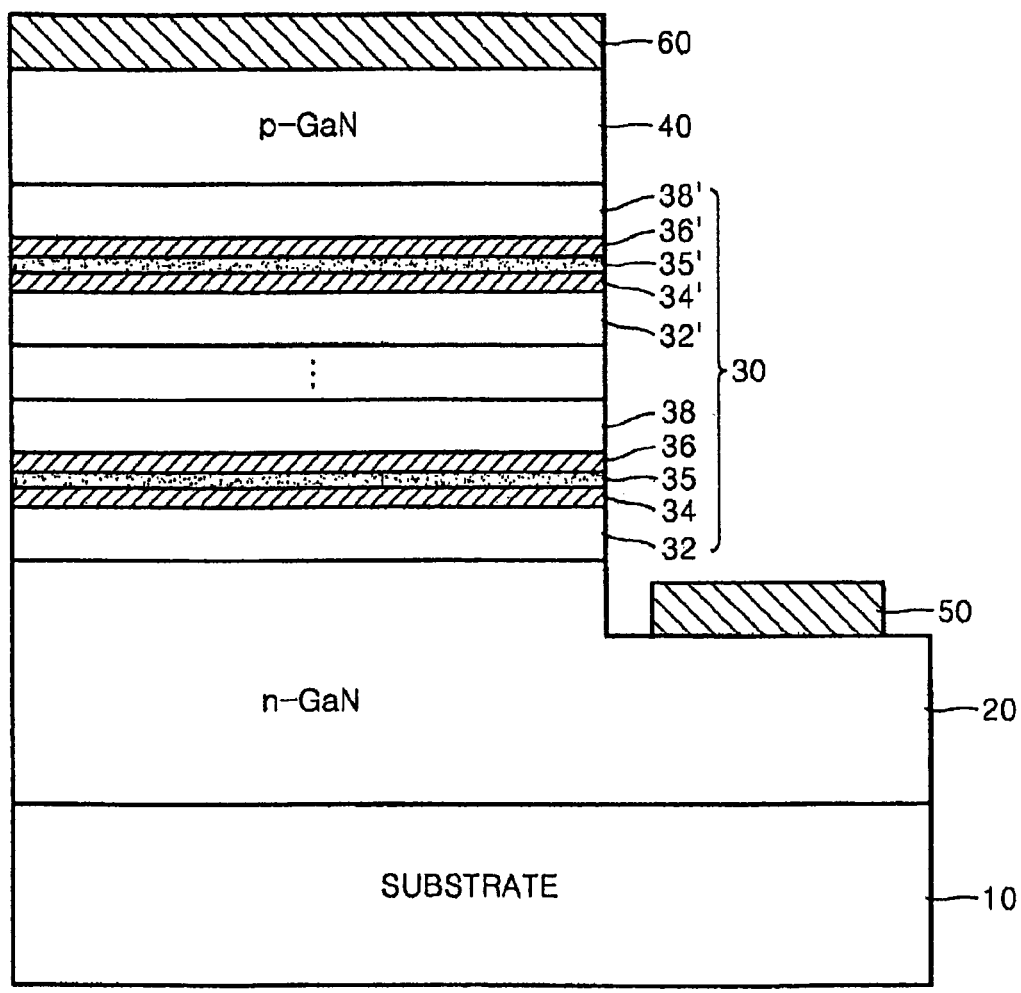
FIG. 5 is a schematic cross-sectional view of a nitride-based semiconductor light emitting device having a multi-quantum well structure according to example embodiments.

Although the active layer 30 has a single quantum well structure in the drawings, example embodiments may not be limited to this structure as illustrated in FIG. 5. For example, another first barrier layer 32', another first diffusion barrier layer 34', another quantum well layer 35', another second diffusion barrier layer 36', and another barrier layer 38' may be sequentially further stacked between the second barrier layer 38 and the p-type semiconductor layer 40, so that the active layer 30 may have a multi-quantum well structure.

According to example embodiments, the active layer of the nitride-based semiconductor light emitting device may include the diffusion barrier layer to prevent or reduce the diffusion of indium (In) elements between the quantum well layer and the adjacent barrier, so that optical output and light emission characteristics of the active layer may be improved. In example embodiments, the diffusion barrier layer may be doped with an anti-defect agent including an N element and a Si element, so that the increased performance/increased quality diffusion barrier layers may be implemented, which has sufficient diffusion preventing or reducing effects even when used in the active layer having an increased indium composition ratio of about 30% or higher. Also, the doping of the anti-defect agent may serve to improve the layer properties, e.g., the surface roughness, of the diffusion barrier layers.

While example embodiments have been particularly shown and described with reference to example embodiments thereof, it will be understood by those of ordinary skill in the art that various changes in form and details may be made therein without departing from the spirit and scope of the following claims.

What is claimed is:

1. A nitride-based semiconductor light emitting device comprising: an n-type semiconductor layer, an active layer, and a p-type semiconductor layer sequentially stacked on a substrate, wherein the active layer comprising:
a first barrier layer formed of In$_x$Ga$_{(1-x)}$N (about 0.01≦x≦about 0.05) on an n-type semiconductor layer;
a first diffusion barrier layer formed of In$_y$Ga$_{(1-y)}$N (about 0≦y<about 0.01) on the first barrier layer, and doped with an anti-defect agent comprising both of an N (nitrogen) element and a Si (silicon) element;
a quantum well layer formed of In$_z$Ga$_{(1-z)}$N (about 0.25≦z≦about 0.35) on the first diffusion barrier layer;
a second diffusion barrier layer formed of In$_y$Ga$_{(1-y)}$N (about 0≦y<about 0.01) on the quantum well layer, and doped with an anti-defect agent comprising both of an N element and a Si; and
a second barrier layer formed of In$_x$Ga$_{(1-x)}$N (about 0.015≦x≦about 0.05) on the second diffusion barrier layer.

2. The nitride-based semiconductor light emitting device of claim 1, wherein the first and second diffusion barrier layers reduce interdiffusion of an In (indium) element between the quantum well layer and the first and second barrier layers.

3. The nitride-based semiconductor light emitting device of claim 1, wherein the doping concentration of the N element ranges from about 1E3 atoms/cm$^3$ to about 1E20 atoms/cm$^3$.

4. The nitride-based semiconductor light emitting device of claim 1, wherein the doping concentration of the Si element ranges from about 1E3 atoms/cm$^3$ to about 1E20 atoms/cm$^3$.

5. The nitride-based semiconductor light emitting device of claim 1, wherein the N element is provided from at least one N source material selected from the group consisting of MMHy (monomethyl hydrazine) and DMHy (dimethyl hydrazine).

6. The nitride-based semiconductor light emitting device of claim 1, wherein the Si element is provided from at least one Si source material selected from the group consisting of SiH$_4$ (silane), Si$_2$H$_6$ (disilane), CH$_3$SiH$_3$ (methyl silane), (CH$_3$)$_2$SiH$_2$ (dimethyl silane), (C$_2$H$_5$)$_2$SiH$_2$ (diethyl silane), (CH$_3$)$_3$SiH (trimethyl silane), (C$_2$H$_5$)$_3$SiH (triethyl silane), TMSi (tetramethyl silane), and TESi (tetraethyl silane).

7. The nitride-based semiconductor light emitting device of claim 1, wherein each of the first and second diffusion barrier layers has a thickness ranging from about 0.2 nm to about 6 nm.

8. The nitride-based semiconductor light emitting device of claim 1, further comprising:
another first diffusion barrier layer, another quantum well layer, another second diffusion barrier layer, and another second barrier layer that are sequentially stacked between the second barrier layer and the p-type semiconductor layer, so that the active layer has a multi-quantum well structure.

9. A method of forming a nitride-based semiconductor light emitting device comprising: forming an n-type semiconductor layer, an active layer, and a p-type semiconductor layer to be sequentially stacked on a substrate, the forming the active layer comprising:
forming a first barrier layer of In$_x$Ga$_{(1-x)}$N (about $0.01 \leq x \leq$ about 0.05) on a n-type semiconductor layer;
forming a first diffusion barrier layer of In$_y$Ga$_{(1-y)}$N (about $0 \leq y <$ about 0.01) on the first barrier layer, and doped with an anti-defect agent comprising both of an N (nitrogen) element and a Si (silicon) element;
forming a quantum well layer of In$_z$Ga$_{(1-z)}$N (about $0.25 \leq z \leq$ about 0.35) on the first diffusion barrier layer;
forming a second diffusion barrier layer of In$_y$Ga$_{(1-y)}$N (about $0 \leq y <$ about 0.01) on the quantum well layer, and doped with an anti-defect agent comprising both of an N element and a Si element; and
forming a second barrier layer of In$_x$Ga$_{(1-x)}$N (about $0.01 \leq x \leq$ about 0.05) on the second diffusion barrier layer.

10. The method of claim 9, wherein the first and second diffusion barrier layers reduce interdiffusion of an In (indium) element between the quantum well layer and the first and second barrier layers.

11. The method of claim 9, wherein forming the first and second diffusion barrier layers includes reacting a doping gas comprising at least one of an N (nitrogen) source material and a Si (silicon) source material with a reaction gas comprising TMGa (trimethyl gallium) and NH$_3$ (ammonia) at a temperature of about 600° C. to about 900° C. by an MOCVD (metalorganic chemical vapor deposition) process.

12. The method of claim 11, wherein the reaction gas further comprises TMI (trimethyl indium).

13. The method of claim 11, wherein the N source material for the anti-defect agent doping comprises at least one selected from the group consisting of MMHy (monomethyl hydrazine) and DMHy (dimethyl hydrazine).

14. The method of claim 13, wherein the flow of DMHy is controlled to meet a condition of about $0 <$ (DMHy/TMGa) $<$ about 20.

15. The method of claim 13, wherein the doping concentration of the N element used as the anti-defect agent is controlled within a range of about 1E3 atoms/cm$^3$ to about 1E20 atoms/cm$^3$.

16. The method of claim 11, wherein the Si source material for the anti-defect agent doping comprises at least one selected from the group consisting of SiH$_4$ (silane), Si$_2$H$_6$ (disilane), CH$_3$SiH$_3$ (methyl silane), (CH$_3$)$_2$SiH$_2$ (dimethyl silane), (C$_2$H$_5$)$_2$SiH$_2$ (diethyl silane), (CH$_3$)$_3$SiH (trimethyl silane), (C$_2$H$_5$)$_3$SiH (triethyl silane), TMSi (tetramethyl silane), and TESi (tetraethyl silane).

17. The method of claim 16, wherein the doping concentration of the Si element used as the anti-defect agent is controlled within a range of about 1E3 atoms/cm$^3$ to about 1E20 atoms/cm$^3$.

18. The method of claim 9, wherein each of the first and second diffusion barrier layers has a thickness ranging from about 0.2 nm to about 6 nm.

19. The method of claim 9, wherein forming each of the first and second barrier layers includes reacting TMGa (trimethyl gallium), TMI (trimethyl indium) and NH$_3$ (ammonia) at a temperature of about 600° C. to about 900° C. by an MOCVD (metalorganic chemical vapor deposition) process.

20. The method of claim 9, wherein forming the quantum well layer includes reacting TMGa (trimethyl gallium), TMI (trimethyl indium) and NH$_3$ (ammonia) at a temperature of about 600° C. to about 900° C. by the MOCVD (metalorganic chemical vapor deposition) process.

21. The method of claim 9, wherein the first barrier layer, the first diffusion barrier layer, the quantum well layer, the second diffusion barrier layer and the second barrier layer are sequentially formed by an in-situ process.

22. The method of claim 9, further comprising:
sequentially stacking another first diffusion barrier layer, another quantum well layer, another second diffusion barrier layer, and another second barrier layer between the second barrier layer and the p-type semiconductor layer, so that the active layer has a multi-quantum well structure.

* * * * *